(12) United States Patent
Bai et al.

(10) Patent No.: US 11,417,541 B2
(45) Date of Patent: Aug. 16, 2022

(54) PROTECTION FROM METAL MIGRATION ON IC PACKAGES

(71) Applicant: NXP USA, Inc., Austin, TX (US)

(72) Inventors: Zhigang Bai, Tianjin (CN); Jinzhong Yao, Tianjin (CN); Xingshou Pang, Tianjin (CN)

(73) Assignee: NXP USA, INC., Austin, TX (US)

( * ) Notice: Subject to any disclaimer, the term of this patent is extended or adjusted under 35 U.S.C. 154(b) by 201 days.

(21) Appl. No.: 16/668,319

(22) Filed: Oct. 30, 2019

(65) Prior Publication Data

US 2021/0066092 A1 Mar. 4, 2021

(30) Foreign Application Priority Data

Aug. 27, 2019 (CN) ......................... 201910799304.1

(51) Int. Cl.
*H01L 21/56* (2006.01)
*H01L 23/495* (2006.01)
(Continued)

(52) U.S. Cl.
CPC ...... *H01L 21/565* (2013.01); *B29C 45/14819* (2013.01); *B29C 45/64* (2013.01);
(Continued)

(58) Field of Classification Search
CPC . H01L 21/565; H01L 23/49541; H01L 24/48; H01L 2224/48177; H01L 21/4842; H01L 23/49555; H01L 23/3107; H01L 24/97; H01L 24/29; H01L 24/32; H01L 24/83; H01L 2224/2919; H01L 2224/32245; H01L 2224/48091; H01L 2224/48247; H01L 2224/49109; H01L 2224/73265; H01L 2224/83192; H01L 2224/92247; H01L 2224/95; H01L 2924/181; H01L 24/49; B29C 45/14819; B29C 45/64; B29C 45/1418;
(Continued)

(56) References Cited

U.S. PATENT DOCUMENTS 6,635,954 B2 * 10/2003 Kinsman ............. H01L 23/4951
257/669
8,497,158 B2 * 7/2013 Low ....................... H01L 24/97
438/112

(Continued)

*Primary Examiner* — Shahed Ahmed
*Assistant Examiner* — Khatib A Rahman (57) ABSTRACT

A mold chase has first and second mold clamps having corresponding teeth and recesses configured such that, when the mold chase is closed onto a sub-assembly having an IC die mounted onto and wire-bonded to a lead frame, there are gaps between the recesses and the leads of the lead frame that allow molding compound to extend along opposing sides of proximal ends of the leads to increase the metal-to-metal distance between adjacent leads, thereby reducing the chances of, for example, tin migrating during HAST testing to form undesirable conduction paths between adjacent leads. In some embodiments, the mold clamp teeth have chamfered edges that are tapered at the mold chase cavity to form wedge-shaped gaps that allow the molding compound to extrude along the proximal ends of the leads of MaxQFP packages having two levels of "J" leads and gullwing leads.

17 Claims, 11 Drawing Sheets

(51) Int. Cl.
*B29C 45/64* (2006.01)
*H01L 23/00* (2006.01)
*B29C 45/14* (2006.01)
*B29L 31/34* (2006.01)

(52) U.S. Cl.
CPC ........ *H01L 23/49541* (2013.01); *H01L 24/48* (2013.01); *B29L 2031/3481* (2013.01); *H01L 2224/48177* (2013.01)

(58) Field of Classification Search
CPC ........ B29C 45/14655; B29C 45/14647; B29C 45/26; B29L 2031/3481
See application file for complete search history.

(56) References Cited

U.S. PATENT DOCUMENTS

| 8,525,311 | B2 | 9/2013 | Bai et al. | |
|---|---|---|---|---|
| 8,810,015 | B2 * | 8/2014 | Camacho | H01L 24/49 257/676 |
| 8,859,339 | B2 * | 10/2014 | Bai | H03K 19/018521 438/123 |
| 9,362,211 | B1 * | 6/2016 | Gao | H01L 23/3121 |
| 9,824,995 | B2 * | 11/2017 | Viswanathan | H01L 23/66 |
| 2012/0056311 | A1 * | 3/2012 | Bai | H01L 23/49558 257/676 |
| 2013/0196473 | A1 * | 8/2013 | Bai | H01L 21/565 438/123 |
| 2015/0206831 | A1 * | 7/2015 | Bai | H01L 21/4842 257/667 |
| 2015/0294924 | A1 * | 10/2015 | Bai | H01L 23/49541 257/676 |
| 2016/0020182 | A1 * | 1/2016 | Higgins, III | H01L 23/3142 257/676 |
| 2016/0027721 | A1 * | 1/2016 | Lee | H01L 24/97 174/261 |
| 2016/0049318 | A1 * | 2/2016 | Bai | H01L 21/67126 257/676 |
| 2020/0203289 | A1 * | 6/2020 | Ching, Jr. | H01L 23/49541 |

* cited by examiner

PROTECTION FROM METAL MIGRATION ON IC PACKAGES

BACKGROUND

The present invention generally relates to integrated circuit (IC) packages, and, more particularly, to techniques for manufacturing such IC packages.

Figure 1A:
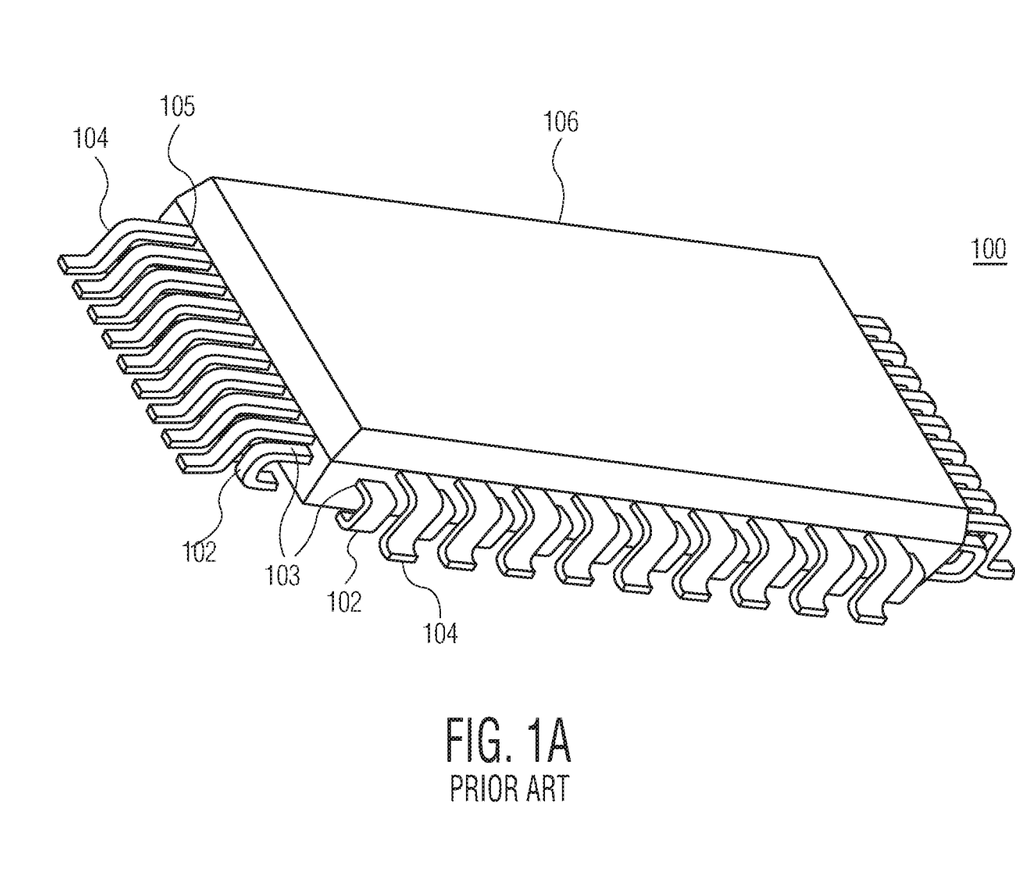
FIG. 1A is a perspective view of a conventional MaxQFP package.
Figure 1B:
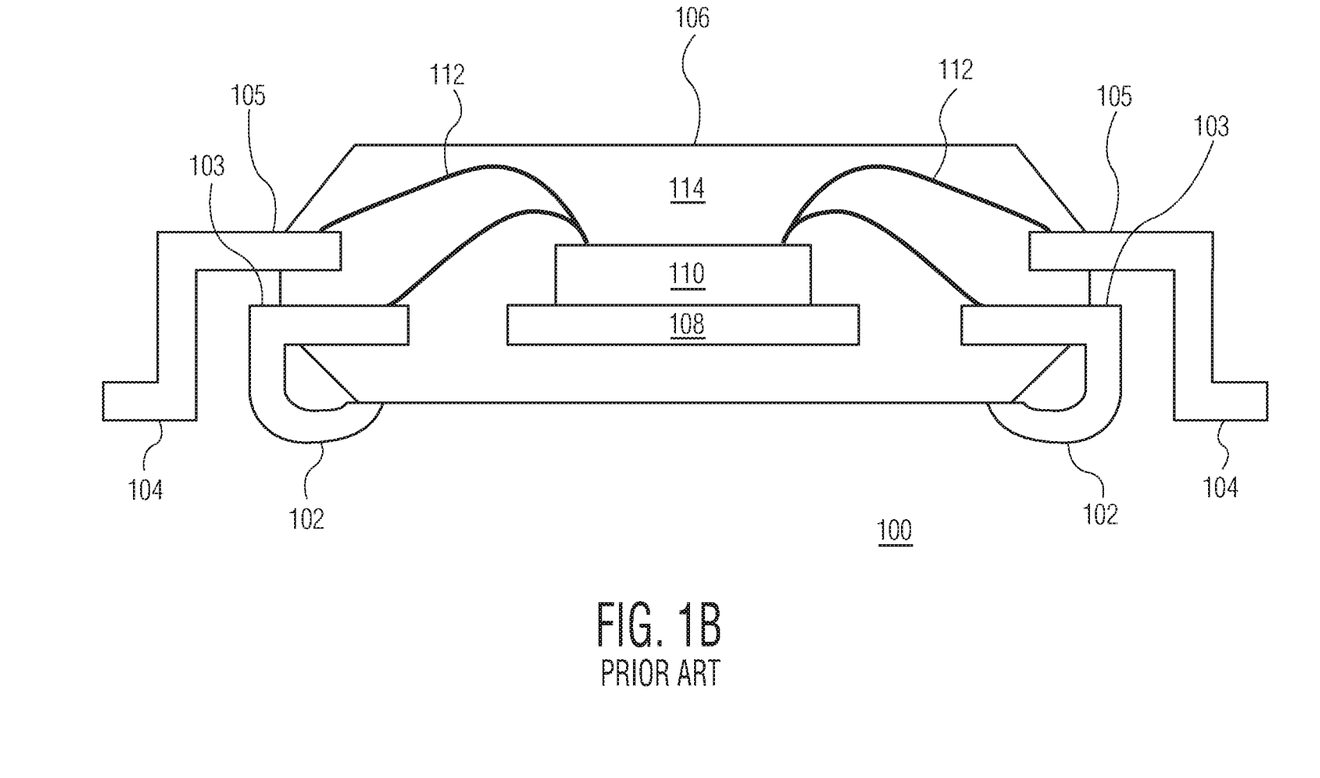
FIG. 1B is a cross-sectional side view of the MaxQFP package of FIG. 1A.

FIG. 1A is a perspective view of a conventional MaxQFP package 100 having alternating "J" leads 102 and gullwing leads 104 extending from the package body 106, and FIG. 1B is a cross-sectional side view of the MaxQFP package 100 of FIG. 1A showing an integrated circuit (IC) die 110 mounted onto a die pad 108 and wire-bonded to the leads 102 and 104 via bond wires 112, all of which are encapsulated within molding compound 114 that defines the package body 106.

As shown in FIGS. 1A and 1B, the proximal ends 103 of the "J" leads 102 are lower on the package body 106 than the proximal ends 105 of the gullwing leads 104. In a typical implementation of the MaxQFP package 100, the metal-to-metal distance between the proximal end 103 of a "J" lead 102 and the proximal end 105 of an adjacent gullwing lead 104 is shorter than the metal-to-metal distance between adjacent leads of a typical QFP package having only "J" leads or only gullwing leads.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

It has been found that, during highly accelerated stress testing (HAST) of MaxQFP packages, such as the MaxQFP package 100 of FIG. 1A, tin in the plating layer of the leads can migrate and form undesirable conductive paths between pairs of adjacent leads. To address this problem, IC packages of the present invention, including, but not limited to, MaxQFP packages having alternating "J" leads and gullwing leads at two different elevations as in the Max QFP package 100 of FIGS. 1A-1B, are purposely manufactured to have molding compound extending along the proximal ends of the package leads in order to increase the metal-to-metal distance between adjacent leads and thereby reduce the probability that metal, such as tin, will migrate, for example, during HAST testing, and form undesirable conductive paths between pairs of adjacent leads. To achieve this configuration, the tooling used to encapsulate IC packages with molding compound is designed with openings for the leads that allow some of the molding compound to extrude during manufacture of the IC package through those openings along one or more sides of the proximal ends of those leads.

In an embodiment of the present invention, an integrated circuit (IC) package, comprises (i) at least one IC encapsulated in molding compound that defines a package body of the IC package and (ii) a plurality of metal leads extending from a periphery of the package body at proximal ends of the leads, wherein molding compound extends along the proximal end of at least one lead to increase metal-to-metal distance between the at least one lead and an adjacent lead.

In another embodiment, the present invention is a method for fabricating an IC package. The method comprises (i) placing a sub-assembly into a mold chase, wherein the sub-assembly comprises an IC mounted onto and wire-bonded to a lead frame, and (ii) flowing molding compound into the mold chase to encapsulate the wire-bonded IC, wherein the mold chase is configured to allow molding compound to extend along a proximal end of at least one lead of the lead frame to increase metal-to-metal distance between the at least one lead and an adjacent lead.

In yet another embodiment, the present invention is a mold chase for fabricating an IC package, the mold chase comprising (i) a first mold clamp having teeth, recesses, and an open cavity and (ii) a second mold clamp having teeth corresponding to the recesses of the first mold clamp, recesses corresponding to the teeth of the first mold clamp, and an open cavity corresponding to the open cavity of the first mold clamp, wherein, when the mold chase is closed over a sub-assembly comprising an IC mounted onto and wirebonded to a lead frame, there is at least one gap between at least one lead of the lead frame and the corresponding recess of the closed mold chase that allows molding compound to extend along a proximal end of the at least one lead to increase metal-to-metal distance between the at least one lead and an adjacent lead.

FIGS. 2A-2F depict the steps of a conventional technique for manufacturing conventional IC packages.

Figure 2A:
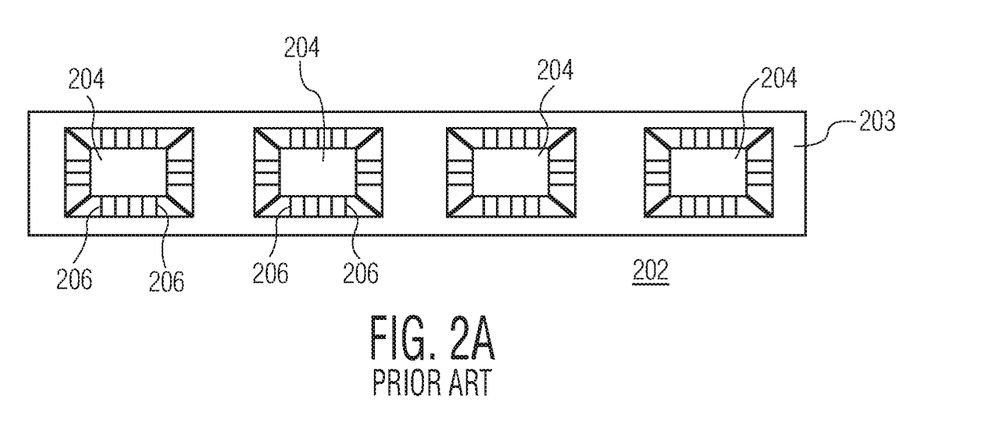
FIGS. 2A-2F depict the steps of a conventional technique for manufacturing conventional IC packages.

FIG. 2A is a plan view of a lead frame 202 that is used to manufacture four IC packages in parallel. The lead frame 202 has support structure 203 that supports four die pads 204 and lead structures 206 that will eventually form the leads of the four IC packages.

Figure 2B:
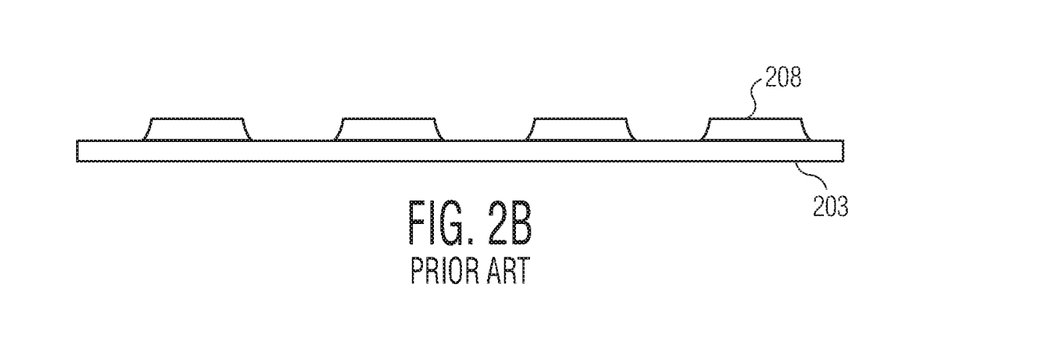

FIG. 2B is a side view of the lead frame 202 of FIG. 2A with epoxy 208 deposited over the four die pads 204 (not explicitly shown in FIG. 2B).

Figure 2C:
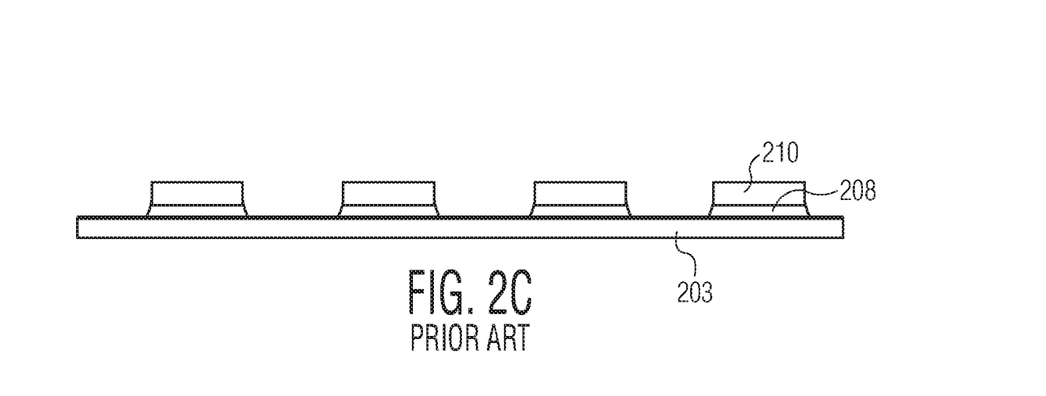

FIG. 2C is a side view of the sub-assembly of FIG. 2B after four IC dies 210 have been mounted onto the four epoxy-covered die pads 204 (not explicitly shown in FIG. 2C).

Figure 2D:
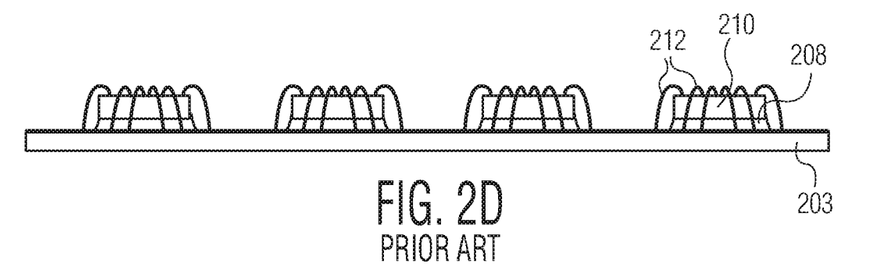

FIG. 2D is a side view of the sub-assembly of FIG. 2C after bond wires 212 have been wire-bonded between the IC dies 210 and the lead structures 206 (not explicitly shown in FIG. 2D).

Figure 2E:
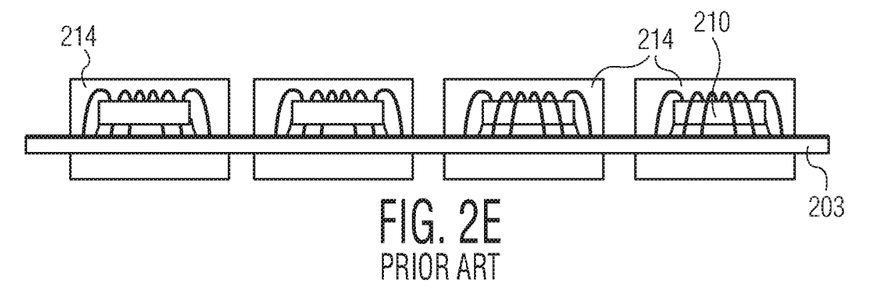

FIG. 2E is a side view of the sub-assembly of FIG. 2D after molding compound 214 has been applied to encapsulate the different wire-bonded IC dies 210.

Figure 2F:
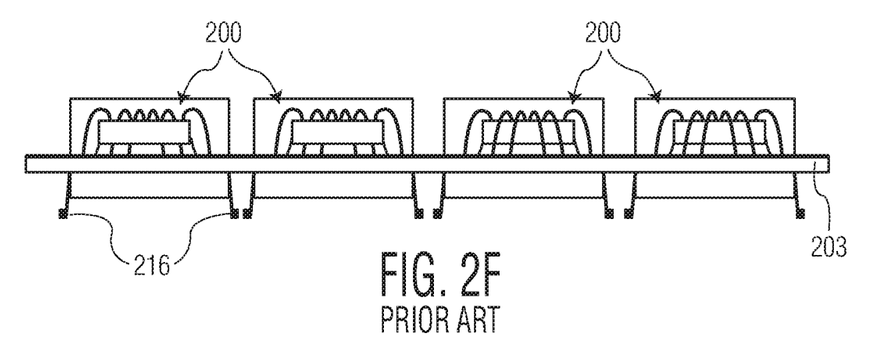

FIG. 2F is a cross-sectional side view of the sub-assembly of FIG. 2E after the lead structures 206 have been trimmed and shaped to form the leads 216 of the four IC packages 200, which can then be singulated from the lead frame support structure 203.

Figure 3A:
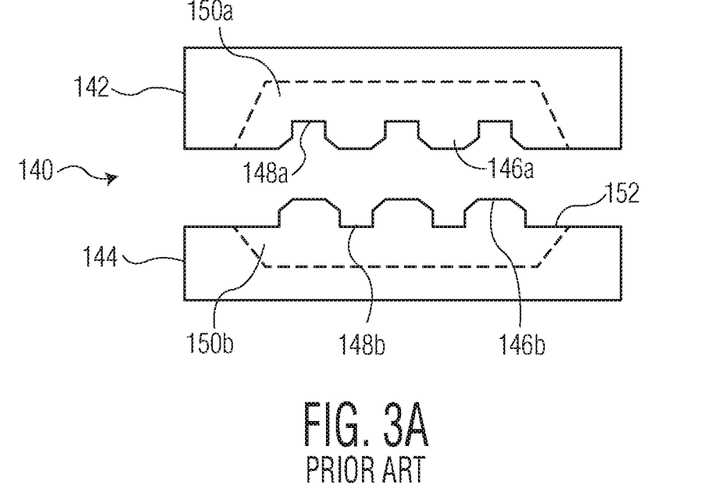
FIGS. 3A and 3B are open and closed side views, respectively, of tooling that can be used to manufacture conventional MaxQFP packages.
Figure 3B:
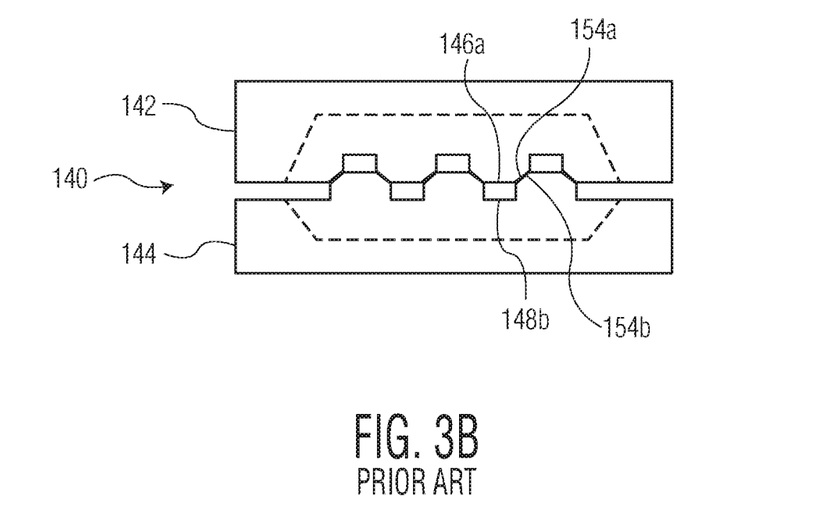

FIGS. 3A and 3B are side views of tooling that can be used to manufacture conventional MaxQFP packages. FIGS. 3A and 3B are based on FIGS. 14A and 14B of U.S. Pat. No. 8,859,339 ("the '339 patent"), the teachings of which are incorporated herein by reference in their entirety.

In particular, FIG. 3A is a side view of a mold chase 140 for packaging an IC die (not shown), where the mold chase 140 is shown in an open position. The mold chase 140 includes first and second toothed mold clamps 142 and 144. The first mold clamp 142 has a plurality of teeth 146a, a corresponding plurality of recesses 148a located between the teeth 146a, and an open cavity 150a located in a center of the first mold clamp 142. Similarly, the second mold clamp 144 also has a plurality of teeth 146b, a corresponding plurality of recesses 148b located between the teeth 146b, and an open cavity 150b located in a center of the second mold clamp 144.

In FIG. 3A, the second mold clamp 144 is shown in facing arrangement with the first mold clamp 142 such that the teeth 146a of the first mold clamp 142 mate with corresponding recesses 148b of the second mold clamp 144, and vice versa. The teeth 146a and 146b of the first and second mold clamps 142 and 144 are chamfered. The teeth 146a of the first mold clamp 142 are wider than the corresponding recesses 148b of the second mold clamp 144. Similarly, the teeth 146b of the second mold clamp 144 are wider than the corresponding recesses 148a of the first mold clamp 142.

FIG. 3B is a side view of the mold chase 140 of FIG. 3A in a closed position. The chamfered edges 154a of the teeth 146a of the first mold clamp 142 mate with chamfered edges 154b of the teeth 146b of the second mold clamp 144. Further, as can be seen, the teeth 146a and 146b do not extend entirely into the opposing recesses 148b and 148a, respectively.

Figure 4A:
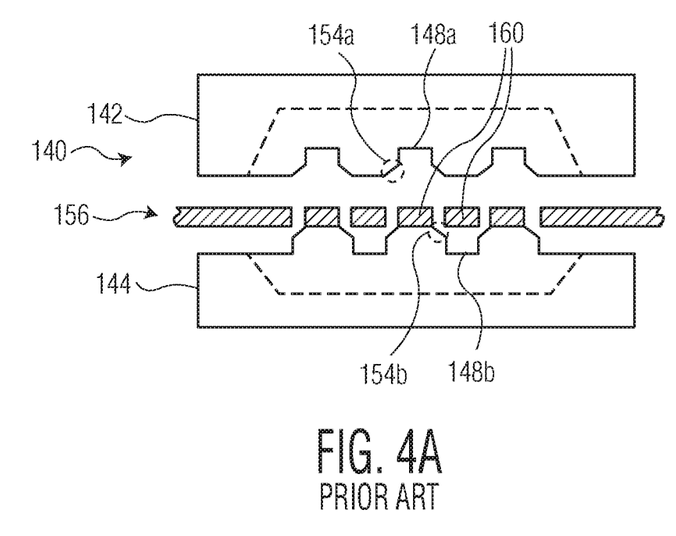
FIGS. 4A and 4B are open and closed side views of the mold chase of FIG. 3A with a lead frame inserted between the first and second mold clamps.

FIG. 4A is a side view of the mold chase 140 of FIG. 3A in an open position with a lead frame 156 having leads 160 inserted between the first and second mold clamps 142 and 144. When clamping the first and the second mold clamps 142, 144 to put the mold chase 140 in the closed position, the chamfers 154 act as guides to align alternating leads 160 of the lead frame 156 within the recesses 148a and 148b of the first and second mold clamps 142 and 144, respectively, to avoid mold tool jam due to lead frame deformation.

Figure 4B:
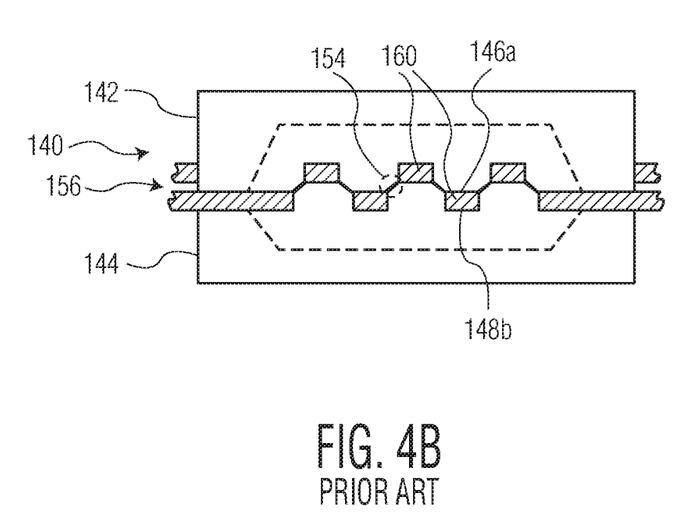

FIG. 4B is a side view of the mold chase 140 of FIG. 4A in a closed position. In the closed position, the leads 160 of the lead frame 156 are bent into two spaced, planar rows. As represented in FIG. 4B, the dimensions of the leads 160 are only slightly smaller than the corresponding dimensions of the openings formed between the teeth 146a/b and the recesses 148b/a when the mold chase 140 is closed, such that there are no gaps between the leads 160 and the recesses 148b in the second mold clamp 144 when the leads 160 are pressed into the recesses 148b in the second mold clamp 144 by the corresponding teeth 146a in the first mold clamp 142, and vice versa for the teeth 146b of the second mold clamp 144 and the recesses 148a of the first mold clamp 142. As such, molding compound will not extrude out of those openings during the molding step of FIG. 2E.

FIGS. 4A and 4B are based on FIGS. 15A and 15B of the '339 patent.

Referring again to the molding step of FIG. 2E, to form conventional MaxQFP packages, the wire-bonded dies 210 of the sub-assembly of FIG. 2D can be encapsulated using four mold chases analogous to the mold chase 140 of FIGS. 3A-3B, where closing each mold chase 140 as shown in FIG. 4B bends the lead frame's lead structures 206 to form the two offset levels of leads 160 shown in FIG. 4B, where the open cavities 150a and 150b form two halves of a closed cavity housing a wire-bonded IC die 210. Molding compound is then injected into the closed cavity of each mold chase 140 to encapsulate the corresponding wire-bonded IC die 210 and form the body of a MaxQFP package.

Figure 5A:
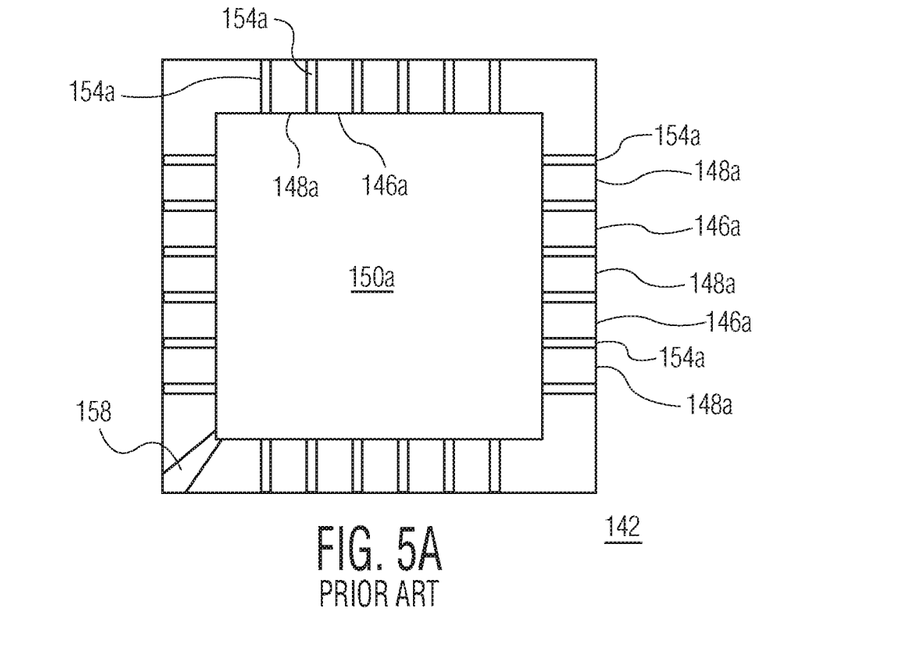
FIGS. 5A and 5B are a plan view and a side view, respectively, of the first mold clamp of FIGS. 3A and 3B.
Figure 5B:
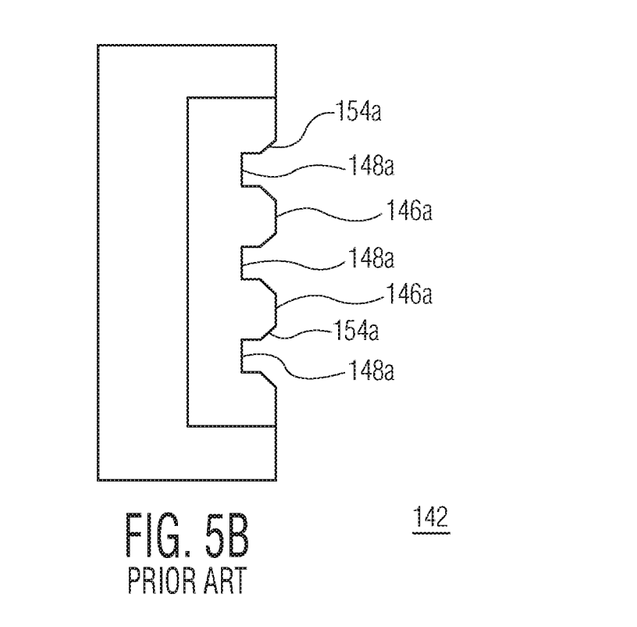

FIGS. 5A and 5B are a plan view and a side view, respectively, of the first mold clamp 142 of FIGS. 3A and 3B. As shown in FIG. 5A, each chamfered edge 154a of each tooth 146a of the first mold clamp 142 has uniform width from the open cavity 150a to the outer edge of the first mold clamp 142. Although not depicted in a figure, each chamfered edge 154b of each tooth 146b of the second mold clamp 144 of FIGS. 3A and 3B also has a similar uniform width from the open cavity 150b to the outer edge of the second mold clamp 144.

As shown in FIG. 5A, the first mold clamp 142 has a trough 158. The second mold clamp 144 has a corresponding trough, such that, when the mold chase 140 is closed as in FIG. 3B, the trough of the second mold clamp 144 abuts the trough 158 of the first mold claim 142 to form a gate through which the molding compound is injected into the closed cavity of the closed mold chase 140.

As described below, the manufacturing technique depicted in FIGS. 2A-2F can be adapted to manufacture IC packages of the present invention by modifying the mold chase tooling used in the molding step of FIG. 2E.

Figure 6A:
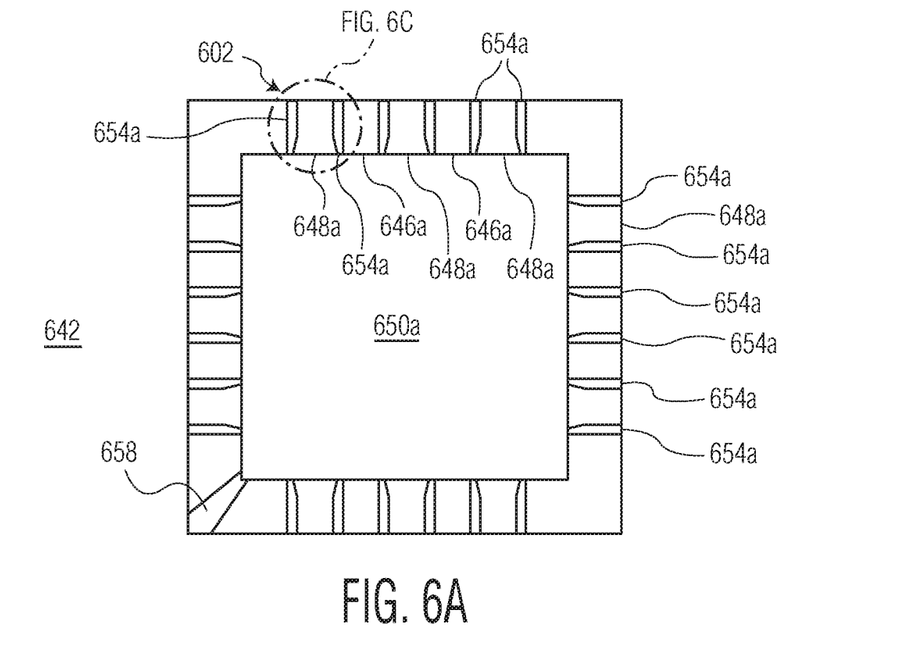
FIGS. 6A and 6B are a plan view and a side view, respectively, of a first mold clamp of a mold chase of the present invention that can be used to form MaxQFP packages of the present invention.
Figure 6B:
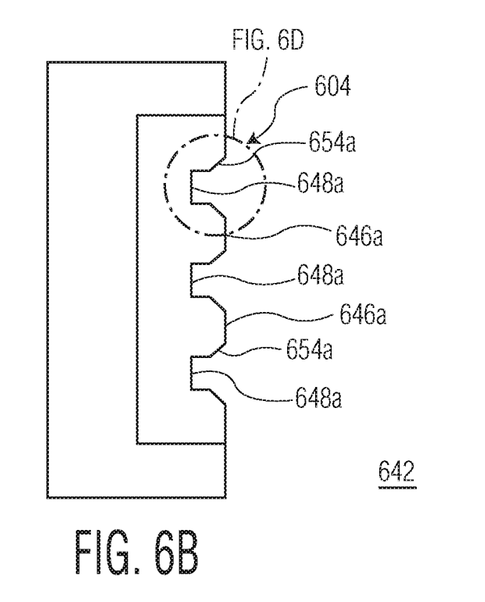
Figure 6C:
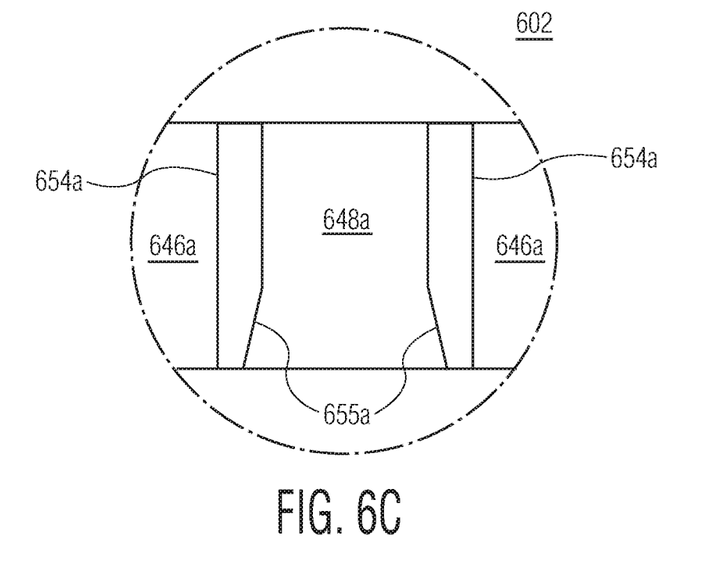
FIG. 6C is a close-up view of the region 602 of FIG. 6A.
Figure 6D:
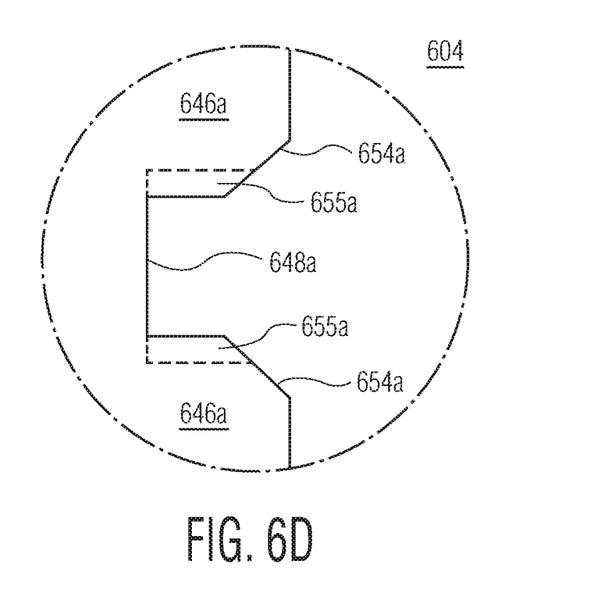
FIG. 6D is a close-up view of the region 604 of FIG. 6B.

FIGS. 6A and 6B are a plan view and a side view, respectively, of a first mold clamp 642 of a mold chase of the present invention that can be used to form MaxQFP packages of the present invention. FIG. 6C is a close-up view of the region 602 of FIG. 6A, and FIG. 6D is a close-up view of the region 604 of FIG. 6B.

Like the first mold clamp 142 of FIGS. 3A-3B, the first mold clamp 642 of FIGS. 6A-6D has recesses 648a and teeth 646*a* with chamfered edges 654*a*. Unlike the first mold clamp 142 of FIGS. 3A-3B, however, each chamfered edge 654*a* does not have uniform width from the open cavity 650*a* to the outer edge of the first mold clamp 642. Rather, as represented in FIGS. 6A and 6C, each chamfered edge 654*a* is tapered at its proximal end 655*a* adjacent the open cavity 650*a*. The tapering of the chamfered edges 654*a* is represented by the dashed lines in the close-up view of FIG. 6D.

Although not depicted in a figure, the mold chase of the present invention has a second mold clamp analogous to the second mold claim 144 of FIGS. 3A-3B but with tapered chamfered edges analogous to the tapered chamfered edges 654*a* of the first mold clamp 642 of FIGS. 6A-6D.

According to an inventive method for manufacturing MaxQFP packages of the present invention, a mold chase of the present invention having the first mold clamp 642 of FIGS. 6A-6D is used instead of the mold chase 140 of FIGS. 3A-3B when performing a modified molding step that is the analog of the conventional molding step of FIG. 2E. All of the other steps of the inventive manufacturing method are substantially identical to the manufacturing steps of FIGS. 2A-2D and 2F.

As shown in FIG. 6A and similar to the first mold chase 142 shown in FIG. 5A, the first mold clamp 642 has a trough 658, and the corresponding second mold clamp has a corresponding trough that abuts the trough 658 when the mold chase is closed to form a gate through which the molding compound is injected into the closed cavity of the mold chase.

Figure 6E:
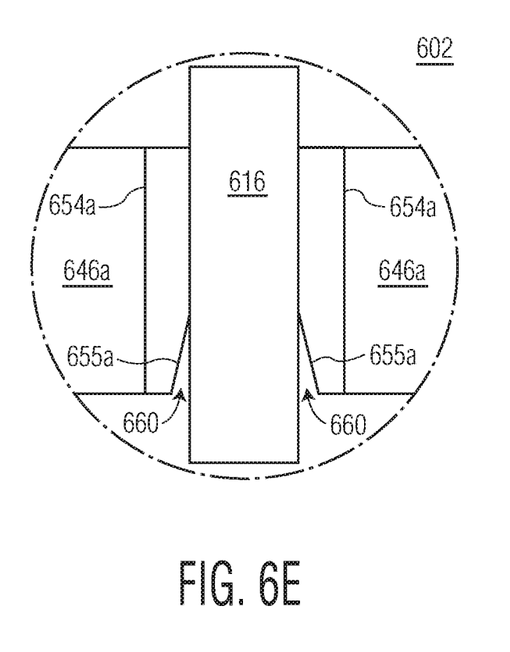
FIG. 6E is a close-up view of the same region 602 of FIG. 6A that is shown in FIG. 6C, but with a lead located within the recess.

FIG. 6E is a close-up view of the same region 602 of FIG. 6A that is shown in FIG. 6C, but with a lead 616 located within the recess 648*a* as would be the situation during the modified molding step of FIG. 2E. As shown in FIG. 6E, the tapered ends 655*a* of the chamfered edges 654*a* of the teeth 646*a* form wedge-shaped gaps 660 on either side of the lead 616 that face the open cavity 650*a* of the first mold clamp 642. As such, when molding compound is injected into the closed cavity of the closed mold chase, the molding compound will extrude into the wedge-shaped gaps 660. After the molding compound is cured and each mold chase is removed, a sub-assembly analogous to the sub-assembly of FIG. 2E will be provided, but there will be a wedge-shaped portion of cured molding compound extending along the two corresponding sides of the proximal end of each lead 616.

Figure 7:
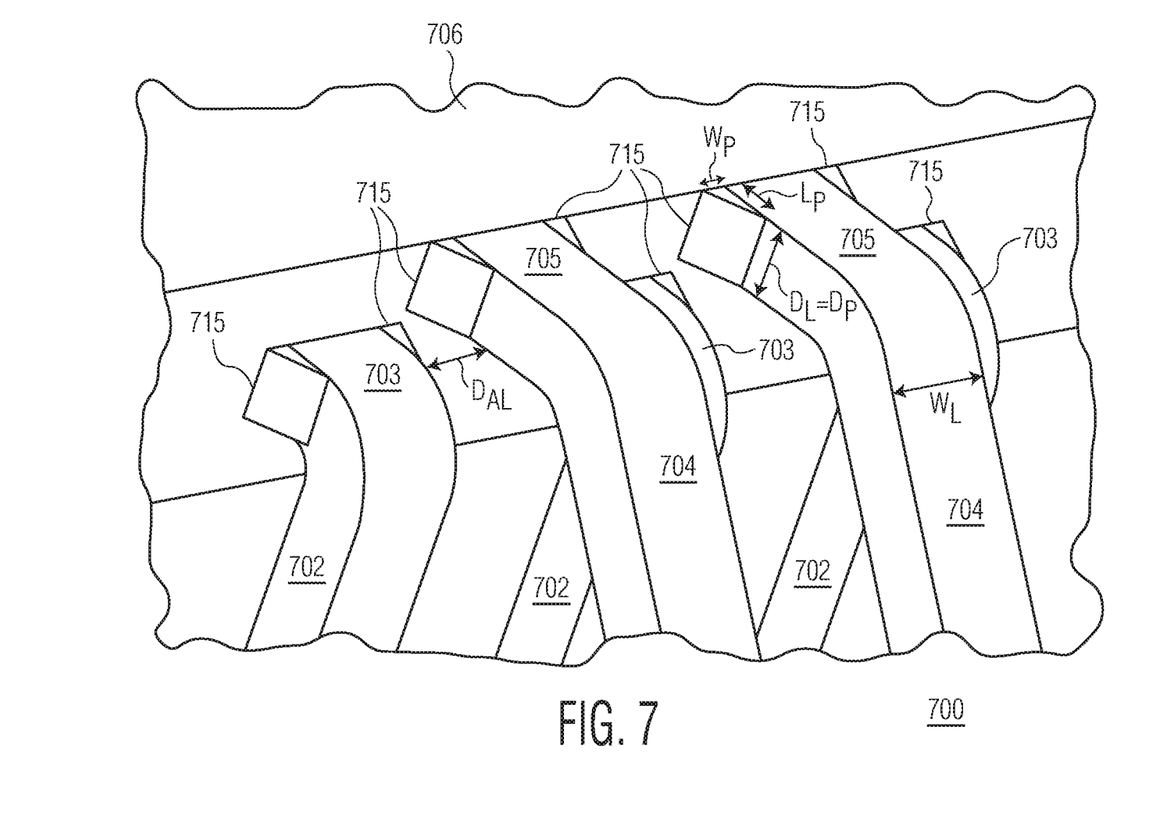
FIG. 7 is a close-up view of a portion of a MaxQFP package 700 according to one embodiment of the present invention.

FIG. 7 is a close-up view of a portion of a MaxQFP package 700 according to one embodiment of the present invention. FIG. 7 shows the proximal ends 703 of three "J" leads 702 and the proximal ends 705 of the two intervening gullwing leads 704. As shown in FIG. 7, the proximal end 703/705 of each lead 702/704 has two wedge-shaped portions 715 of cured molding compound extending along the two opposing sides of the leads beyond the outer surface of the device body 706. These wedge-shaped portions 715 have the effect of increasing the metal-to-metal distances between the proximal ends 703 of the "J" leads 702 and the proximal ends 705 of the adjacent gullwing leads 704, thereby decreasing the chances that metal, such as tin, will migrate, for example, during HAST testing, and form undesirable conductive paths between pairs of adjacent leads.

In one example implementation, the leads 702/704 have widths $W_L$ of about 0.205 mm and depths $D_L$ of about 0.127 mm, the distances $D_{AL}$ between adjacent leads is about 0.12 mm, and the wedge-shaped portions 715 of molding compound have widths $W_P$ of about 0.06 mm at the device body 706, lengths $L_P$ of about 0.15 mm along the sides of the leads 702/704, and depths $D_P$ equal to the depths $D_L$ of the leads 702/704. Other implementations may have other suitable dimensions for the leads 702/704 and/or the wedge-shaped portions 715 of molding compound.

Although the invention has been described in the context of undesirable conductive paths of tin formed during HAST testing, those skilled in the art will understand that the invention can prevent undesirable conductive paths of metals other than tin and/or formed during procedures other than HAST testing.

Although the invention has been described in the context of MaxQFP packages having a single IC die mounted onto a single die pad, other embodiments of the invention may involve IC packages other than MaxQFP packages and/or IC packages having one or more IC dies and/or one or more additional components mounted onto one or more different die pads, including IC packages having only one type of lead and/or IC packages having only one level of leads.

A lead frame is a collection of metal leads and possibly other elements (e.g., power bars, die pads also known as die paddles and die flags) that is used in semiconductor packaging for assembling one or more integrated circuit (IC) dies into a single packaged semiconductor device. Prior to assembly into a packaged device, a lead frame may have support structures (e.g., a rectangular metal frame and tie bars) that keep those other elements in place. During the assembly process, the support structures may be removed. As used herein, the term "lead frame" may be used to refer to the collection of elements before assembly or after assembly, regardless of the presence or absence of those support structures.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit (IC) package, comprising:
   at least one IC encapsulated in molding compound that defines a package body of the IC package; and
   a plurality of metal leads extending from a periphery of the package body at proximal ends of the leads, wherein molding compound extends along the proximal end of at least one lead to increase metal-to-metal distance between the at least one lead and an adjacent lead;
   wherein:
      the IC package comprises alternating "J" leads and gullwing leads, wherein the proximal ends of the "J" leads are at a level on the IC package different from a level of the proximal ends of the gullwing leads; and
      a wedge-shaped portion of molding compound extends along each of two opposing sides of the proximal end of each lead, but not along top and bottom of the proximal end of each lead, to increase the metal-to-metal distance between each pair of adjacent leads.

2. The IC package of claim 1, wherein the IC package comprises alternating "J" leads and gullwing leads, wherein the proximal ends of the "J" leads are at a level on the IC package different from a level of the proximal ends of the gullwing leads.

3. The IC package of claim 1, wherein molding compound extends along two opposing sides of the proximal end of the at least one lead, but not along top and bottom of the proximal end of the at least one lead.

4. The IC package of claim 1, wherein a wedge-shaped portion of molding compound extends along the proximal end of the at least one lead.

5. The IC package of claim 1, wherein molding compound extends along the proximal end of each lead to increase the metal-to-metal distance between each pair of adjacent leads.

6. A mold chase for fabricating an IC package, the mold chase comprising:
   a first mold clamp having teeth, recesses, and an open cavity; and
   a second mold clamp having teeth corresponding to the recesses of the first mold clamp, recesses corresponding to the teeth of the first mold clamp, and an open cavity corresponding to the open cavity of the first mold clamp, wherein, when the mold chase is closed over a sub-assembly comprising an IC mounted onto and wirebonded to a lead frame, there is at least one gap between at least one lead of the lead frame and the corresponding recess of the closed mold chase that allows molding compound to extend along a proximal end of the at least one lead to increase metal-to-metal distance between the at least one lead and an adjacent lead.

7. The mold chase of claim 6, wherein a tooth corresponding to the at least one lead has a chamfered edge that is tapered at an end of the chamfered edge proximal to the open cavity of the corresponding mold clamp to provide the at least one gap having a wedge shape.

8. The mold chase of claim 6, wherein the mold chase is configured to bend lead structures of the lead frame to form two different levels of leads when the mold chase is closed over the sub-assembly.

9. The mold chase of claim 6, wherein the closed mold chase has two gaps on either side of each lead that allow molding compound to extend along the proximal end of each lead to increase metal-to-metal distance between adjacent pairs of leads.

10. The mold chase of claim 6, wherein:
   a tooth corresponding to the at least one lead has a chamfered edge that is tapered at an end of the chamfered edge proximal to the open cavity of the corresponding mold clamp to provide the at least one gap having a wedge shape;
   the mold chase is configured to bend lead structures of the lead frame to form two different levels of leads when the mold chase is closed over the sub-assembly; and
   the closed mold chase has two gaps on either side of each lead that allow molding compound to extend along the proximal end of each lead to increase metal-to-metal distance between adjacent pairs of leads.

11. An integrated circuit (IC) package, comprising:
   at least one IC encapsulated in molding compound that defines a package body of the IC package; and
   a plurality of metal leads extending from a periphery of the package body at proximal ends of the metal leads at a same level on the IC package, wherein a wedge-shaped portion of molding compound extends along and transversely across a side of the proximal end of a lead of the plurality of metal leads that faces a side of the proximal end of an adjacent lead of the plurality of metal leads.

12. The IC package of claim 11 wherein a second wedge-shaped portion of molding compound extends along and transversely across the side of the proximal end of the adjacent lead that faces the side of the proximal end of the lead.

13. The IC package of claim 11 wherein a second wedge-shaped portion of molding compound extends along and transversely across a second side of the proximal end of the lead that faces a side of the proximal end of a second adjacent lead of the plurality of metal leads, wherein the second side of the proximal end of the lead is an opposing side to the side of the proximal end of the lead and the adjacent lead is on an opposite side of the lead from the second adjacent lead.

14. The IC package of claim 13 wherein;
   a third wedge-shaped portion of molding compound extends along and transversely across the side of the proximal end of the adjacent lead that faces the side of the proximal end of the lead;
   a fourth wedge-shaped portion of molding compound extends along and transversely across the side of the proximal end of the second adjacent lead that faces the second side of the proximal end of the lead.

15. The IC package of claim 11 wherein a wedge-shaped portion of molding compound does not extend along a top and bottom sides of the proximal end of the lead.

16. The IC package of claim 11 wherein the plurality of metal leads are characterized as "J" leads.

17. The IC package of claim 11 wherein the plurality of metal leads are characterized as gullwing leads.

\* \* \* \* \*